US012055973B2

(12) United States Patent
Wang et al.

(10) Patent No.: US 12,055,973 B2
(45) Date of Patent: Aug. 6, 2024

(54) DUAL BOARD-TO-BOARD CONNECTOR BATTERY MANAGEMENT CIRCUIT MODULE UTILIZING A SWITCH-BACK SERVICE LOOP

(71) Applicant: Apple Inc., Cupertino, CA (US)

(72) Inventors: Depeng Wang, Santa Clara, CA (US); Andrew U. Leopold, San Francisco, CA (US); Gregory N. Stevens, San Jose, CA (US); Jonathan C. Wilson, San Jose, CA (US); James B. Smith, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 569 days.

(21) Appl. No.: 17/018,130

(22) Filed: Sep. 11, 2020

(65) Prior Publication Data

US 2021/0081000 A1 Mar. 18, 2021

Related U.S. Application Data

(60) Provisional application No. 62/900,261, filed on Sep. 13, 2019.

(51) Int. Cl.
*G06F 1/16* (2006.01)
*H01M 10/42* (2006.01)
(Continued)

(52) U.S. Cl.
CPC .......... *G06F 1/1632* (2013.01); *G06F 1/1635* (2013.01); *H01M 10/425* (2013.01);
(Continued)

(58) Field of Classification Search
CPC .. G06F 1/1632; G06F 1/1635; H01M 10/425; H01M 10/42; H01M 50/247; H01M 50/296; H01M 50/531; H01M 50/298; H01M 50/528; H01M 50/55; H01M 50/557; H01M 50/105; H01M 2010/4271; H01M 2220/30; H05K 1/14; H05K 2201/055; H05K 2201/10037; Y02E 60/10
(Continued)

(56) References Cited

U.S. PATENT DOCUMENTS

2008/0113264 A1* 5/2008 Inagaki ............... H01M 50/211
429/231.1
2011/0268996 A1* 11/2011 Lee ..................... H01M 10/425
429/7
(Continued)

FOREIGN PATENT DOCUMENTS

CN 213124646 U * 5/2021
WO WO-2019018990 A1 * 1/2019 ............... H02J 7/00

*Primary Examiner* — Zhengfu J Feng
(74) *Attorney, Agent, or Firm* — BakerHostetler (57) ABSTRACT

The disclosed technology relates to a dual board-to-board connector battery management circuit module utilizing a switch-back service loop for a battery pack. The management circuit module is coupled to a first and second terminal of a battery pack and includes a first board-to-board connector disposed proximal to a first end of the management circuit module; and a second board-to-board connector disposed proximal to a second end of the management circuit module. The second board-to-board connector is positioned opposite the first board-to-board connector.

17 Claims, 8 Drawing Sheets

(51) Int. Cl.
    *H01M 50/247* (2021.01)
    *H01M 50/296* (2021.01)
    *H01M 50/531* (2021.01)
    *H05K 1/14* (2006.01)
(52) U.S. Cl.
    CPC ....... *H01M 50/247* (2021.01); *H01M 50/296* (2021.01); *H01M 50/531* (2021.01); *H05K 1/14* (2013.01); *H01M 2010/4271* (2013.01); *H01M 2220/30* (2013.01); *H05K 2201/055* (2013.01); *H05K 2201/10037* (2013.01)
(58) Field of Classification Search
    USPC .................................................. 361/679.55
    See application file for complete search history.

(56) References Cited

U.S. PATENT DOCUMENTS

2015/0130979 A1* 5/2015 Huang .................... H01F 38/14
                                                        348/333.01
2015/0372526 A1* 12/2015 Greening ............ H02M 3/1582
                                                        320/134
2016/0308255 A1* 10/2016 Han .................... H01M 50/503
2017/0062794 A1* 3/2017 Lee ....................... H01M 50/55
2019/0305303 A1* 10/2019 Yebka .................... H01M 4/366

* cited by examiner

DUAL BOARD-TO-BOARD CONNECTOR BATTERY MANAGEMENT CIRCUIT MODULE UTILIZING A SWITCH-BACK SERVICE LOOP

PRIORITY

This application claims the benefit under 35 U.S.C. § 119(e) of U.S. Provisional Patent Application Ser. No. 62/900,261, entitled "DUAL BOARD-TO-BOARD CONNECTOR BATTERY MANAGEMENT CIRCUIT MODULE UTILIZING A SWITCH-BACK SERVICE LOOP," filed on Sep. 13, 2019, which is incorporated herein by reference in its entirety.

TECHNICAL FIELD

The present disclosure relates generally to a battery management circuit module for use with battery packs, and more particularly, to a dual board-to-board connector battery management circuit module utilizing a switch-back service loop.

BACKGROUND

Battery packs are used to provide power to a wide variety of portable electronic devices, including laptop computers, tablet computers, mobile phones, personal digital assistants (PDAs), digital music players, watches, and wearable devices. A commonly used type of battery is a lithium battery, which can include a lithium-ion or a lithium-polymer battery.

Lithium batteries often include cells that are made of an anode layer and a cathode layer, with a separator disposed there-between. The layers may be packaged or wound in an enclosure. A first conductive tab may be coupled to the cathode layer and a second conductive tab may be coupled to the anode layer. The first and second conductive tabs may extend through the enclosure to provide terminals for the battery cell. The terminals for the battery cell may be coupled to a battery management circuit module that is configured to manage recharging and discharging of the battery cell.

The management circuit module may include a single connector to couple the battery pack to components of a system, such as a printed circuit board of a portable electronic device. Because a single connector is used, the printed circuit board must house numerous components, such as, a processor, memory, speaker, microphone, amplifier, charging components, and/or other components of the portable electronic device. Housing numerous components on a single printed circuit board may require additional volume within the portable electronic device to house such components, which may reduce a volume that could otherwise be occupied by the battery pack thereby reducing a potential capacity of the battery. In addition, to enable a connection between the battery pack and the printed circuit board, a connector of the management circuit module may utilize an S-bend service loop. The S-bend service loop, however, may provide insufficient length to adequately manipulate the connector and may require a larger cutout in the printed circuit board to accommodate the S-bend service loop. Accordingly, there is a need for a management circuit module to enable efficient packaging of components within a portable electronic device, while enabling more flexibility to connect to system components using an improved service loop.

SUMMARY

The disclosed embodiments provide for a battery pack that utilizes a dual board-to-board connector battery management circuit module utilizing a switch-back service loop. The battery pack includes a set of layers having a cathode layer, an anode layer, and a separator layer disposed between the cathode layer and the anode layer. The battery pack also includes an enclosure enclosing the set of layers, and a first and second terminal extending from the enclosure that are coupled to the cathode layer and anode layer, respectively. The battery pack also includes a management circuit module coupled to the first and second terminal. The management circuit module includes a first board-to-board connector disposed proximal to a first end of the management circuit module; and a second board-to-board connector disposed proximal to a second end of the management circuit module and positioned opposite the first board-to-board connector.

In some embodiments, a portable electronic device utilizing a dual board-to-board connector battery management circuit module utilizing a switch-back service loop is disclosed. The portable electronic device includes a first printed circuit board, a second printed circuit board, and a battery pack. The battery pack includes a set of layers having a cathode layer, an anode layer, and a separator layer disposed between the cathode layer and the anode layer. The battery pack also includes an enclosure enclosing the set of layers, and a first and second terminal extending from the enclosure that are coupled to the cathode layer and anode layer, respectively. The battery pack also includes a management circuit module coupled to the first and second terminal. The management circuit module includes a first board-to-board connector disposed proximal to a first end of the management circuit module that is electrically coupled to the first printed circuit board; and a second board-to-board connector disposed proximal to a second end of the management circuit module, positioned opposite the first board-to-board connector, that is electrically coupled to the second printed circuit board.

In some embodiments, a method for connecting a battery to components of a portable electronic device is disclosed. The method includes disposing a battery pack, main logic board, and a charging board within a portable electronic device. The battery pack includes a set of layers having a cathode layer, an anode layer, and a separator layer disposed between the cathode layer and the anode layer; an enclosure enclosing the set of layers; and a first and second terminal extending from the enclosure. The first and second terminal is electrically coupled to the cathode layer and anode layer, respectively. The battery pack also includes a management circuit module coupled to the first and second terminal. The management circuit module includes a first board-to-board connector disposed proximal to a first end of the management circuit module; and a second board-to-board connector disposed proximal to a second end of the management circuit module and positioned opposite the first board-to-board connector. The method further includes connecting the first board-to-board connector to the main logic board; and connecting the second board-to-board connector to the charging board.

BRIEF DESCRIPTION OF THE DRAWINGS

The embodiments herein may be better understood by referring to the following description in conjunction with the accompanying drawings in which like reference numerals indicate identical or functionally similar elements. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

The disclosed technology addresses limitations of management circuit modules by utilizing a dual board-to-board connector battery management circuit module to enable efficient packaging of system components amongst a plurality of printed circuit boards and by utilizing a switch-back service loop that provides sufficient length to adequately manipulate the connectors without requiring large cutouts in the printed circuit boards to accommodate the switch-back service loop.

Figure 1:
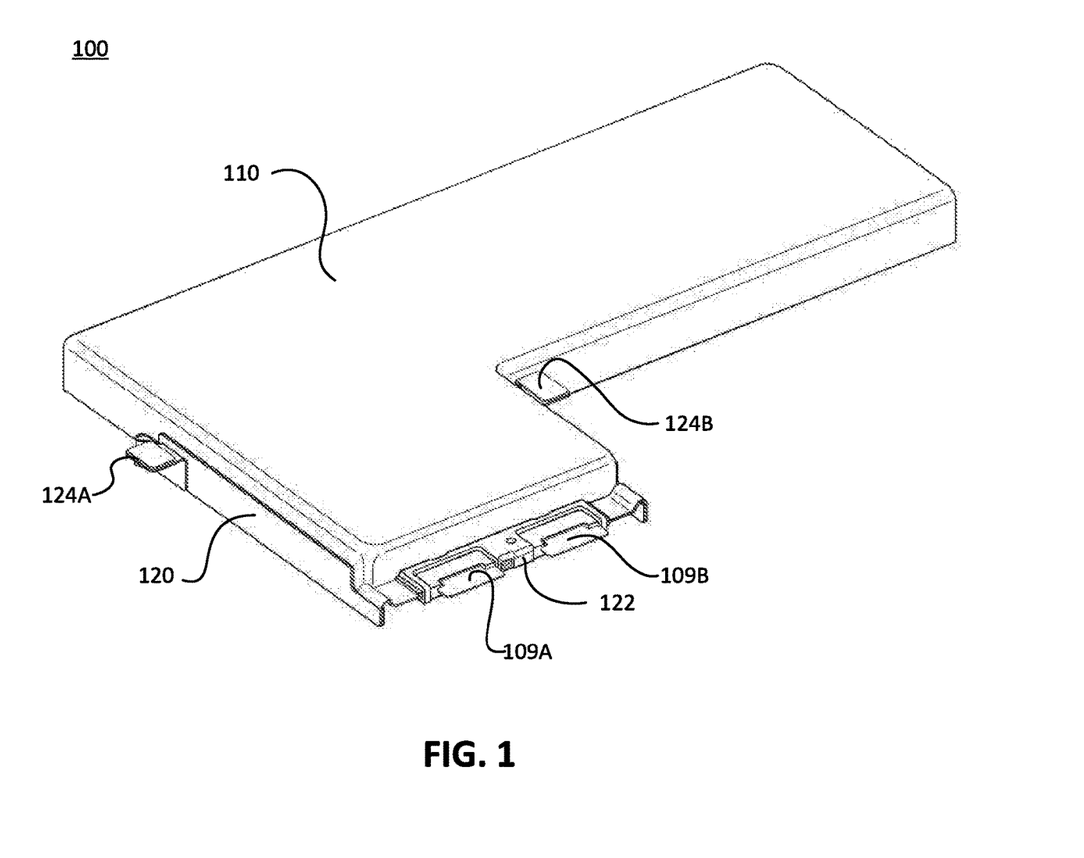
FIG. 1 illustrates a perspective view of a battery pack, in accordance with various embodiments of the subject technology.

FIG. 1 illustrates a perspective view of a battery pack 100, in accordance with various embodiments of the subject technology. The battery pack 100 comprises an enclosure 110, a set of layers enclosed within the enclosure 110, and a battery management circuit module 120. The enclosure 110 may comprise a can, pouch, or other type of enclosure as would be known by a person of ordinary skill. The set of layers may comprise at least one cathode layer with an active coating, at least one anode layer with an active coating, and a separator disposed between the cathode layer and the anode layer, as discussed further below with reference to FIG. 7. The set of layers may be packaged or wound within the enclosure 110. A first conductive tab may be electrically coupled to the cathode layer and a second conductive tab may be electrically coupled to the anode layer. The first and second conductive tabs may extend through the enclosure 110 to provide a first terminal 109A and a second terminal 109B for one or more battery cells enclosed within the enclosure 110. The terminals 109A-B extending from the enclosure 110 may be electrically coupled to the battery management circuit module 120.

The battery management circuit module 120 is configured to manage recharging and discharging of the battery pack 100, as well as monitor the battery pack 100. The battery management circuit module 120 may comprise an integrated circuit 122 having cutoff field-effect transmitters (FETs), fuel-gauge monitor, cell-voltage monitor, cell-voltage balance, real-time clock, and/or a temperature monitor. The battery management circuit module 120 comprises a first board-to-board connector 124A disposed proximal to a first end of the battery management circuit module 120, and a second board-to-board connector 124B disposed proximal to a second end of the battery management circuit module 120. The second board-to-board connector 124B may be positioned opposite the first board-to-board connector 124A. Extending between the first board-to-board connector 124A and the second board-to-board connector 124B may be at least one of a flexible circuit board, rigid circuit board, and/or a rigid-flexible circuit board.

Figure 2:
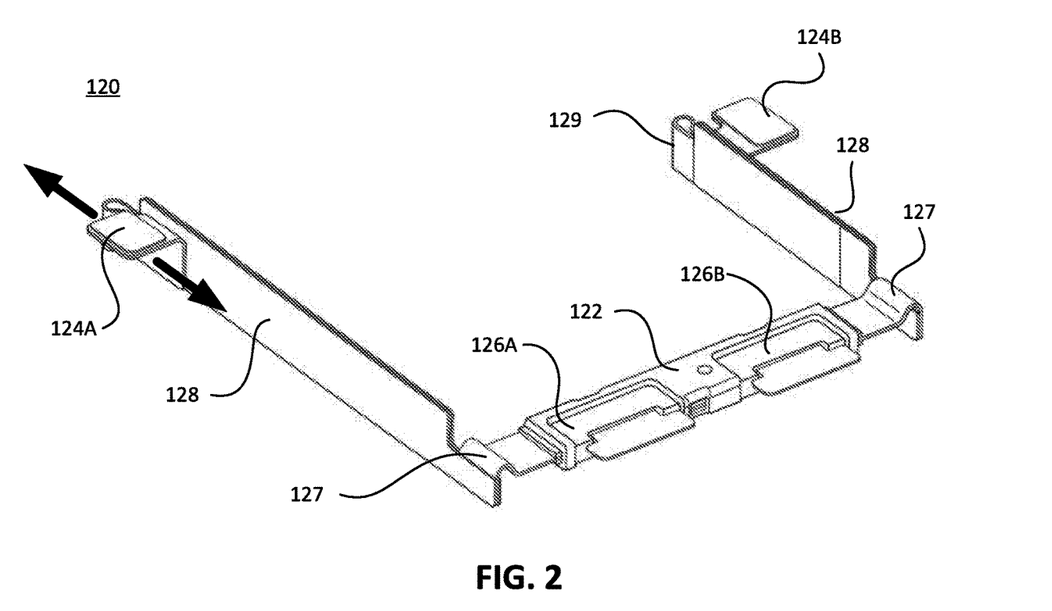
FIG. 2 illustrates a perspective view of a dual board-to-board connector battery management circuit module utilizing a switch-back service loop, in accordance with various embodiments of the subject technology.

FIG. 2 illustrates a perspective view of a dual board-to-board connector battery management circuit module 120 utilizing a switch-back service loop, in accordance with various embodiments of the subject technology. In one aspect, the battery management circuit module 120 forms a "U" shape, with the integrated circuit 122 disposed at a middle portion of the battery management circuit module 120. Disposed proximate to the integrated circuit 122 is a first connection pad 126A that is configured to electrically couple to the first terminal 109A of the battery pack 100 and a second connection pad 126B that is configured to couple to the second terminal 109B of the battery pack 100.

The first board-to-board connector 124A is disposed on an elongated portion 128 of the battery management circuit module 120 that may comprise a flex circuit board, rigid circuit board, and/or a rigid-flexible circuit board. Opposite the first board-to-board connector 124A, the second board-to-board connector 124B is disposed on an elongated portion 128 of the battery management circuit module 120 that may comprise a flex circuit board, rigid circuit board, and/or a rigid-flexible circuit board. The elongated portions 128 may be disposed on planes that are orthogonal to a plane that the integrated circuit 122 is disposed on. To facilitate a transition between the plane of the integrated circuit 122 and the planes of the elongated portions 128, a corner portion 127 may comprise a flexible circuit board.

Figure 3A:
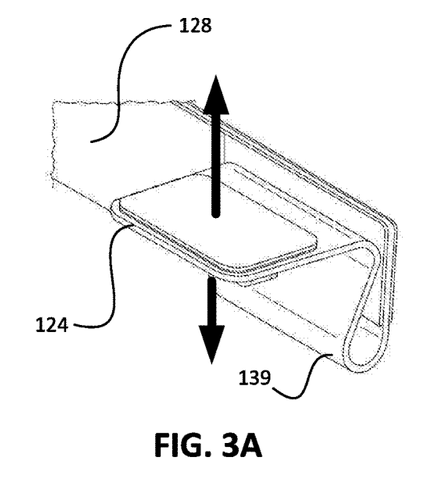
FIG. 3A illustrates a detail view of an embodiment of an S-bend service loop.

In one aspect, each of the first board-to-board connector 124A and the second board-to-board connector 124B may utilize a switch-back service loop 129 that enables a positon of the first board-to-board connector 124A and the second board-to-board connector 124B to be adjusted longitudinally along the elongated portions 128. By utilizing the switch-back service loop 129 for each of the first board-to-board connector 124A and the second board-to-board connector 124B, a working length for each of the first board-to-board connector 124A and the second board-to-board connector 124B is increased over an S-bend service loops (as shown in FIG. 3A). This additional length in a direction along the elongated portion 128 enables coupling of the first board-to-board connector 124A and the second board-to-board connector 124B to corresponding system components. For example, the first board-to-board connector 124A may be connected to a first printed circuit board, and the second board-to-board connector 124B may be connected to a second printed circuit board that is separate from the first printed circuit board.

FIG. 3A illustrates a detail view of an S-bend service loop 139. The S-bend service loop 139 extends vertically with respect to an elongated portion 128 to enable a board-to-board connector 124 to adjust vertically with respect to the elongated portion 128. However the S-bend service loop 139 does not provide a length of flexible circuit board along the longitudinal direction.

Figure 3B:
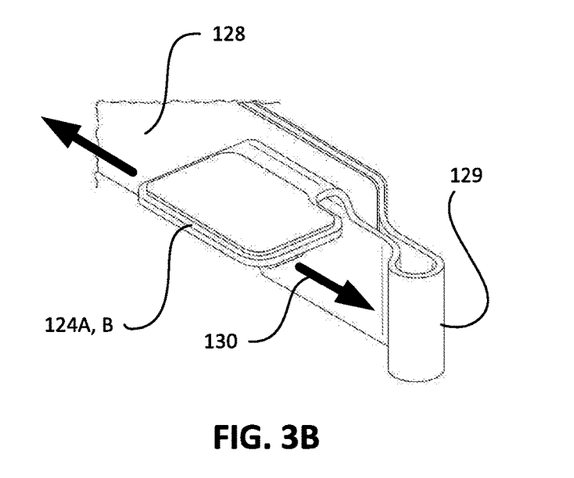
FIG. 3B illustrates a detail view of a switch-back service loop, in accordance with various embodiments of the subject technology.

FIG. 3B illustrates a detail view of a switch-back service loop 129, in accordance with various embodiments of the subject technology. In contrast to the S-bend service loop 139 shown in FIG. 3A, the switch-back service loop 129 extends in a longitudinal direction 130 (e.g. horizontally) with respect to the elongated portion 128 to enable the first board-to-board connector 124A or the second board-to-board connector 124B to move longitudinally along the elongated portion 128. The switch-back service loop 129 thereby provides an additional length of flexible circuit board in the longitudinal direction 130.

Figure 4A:
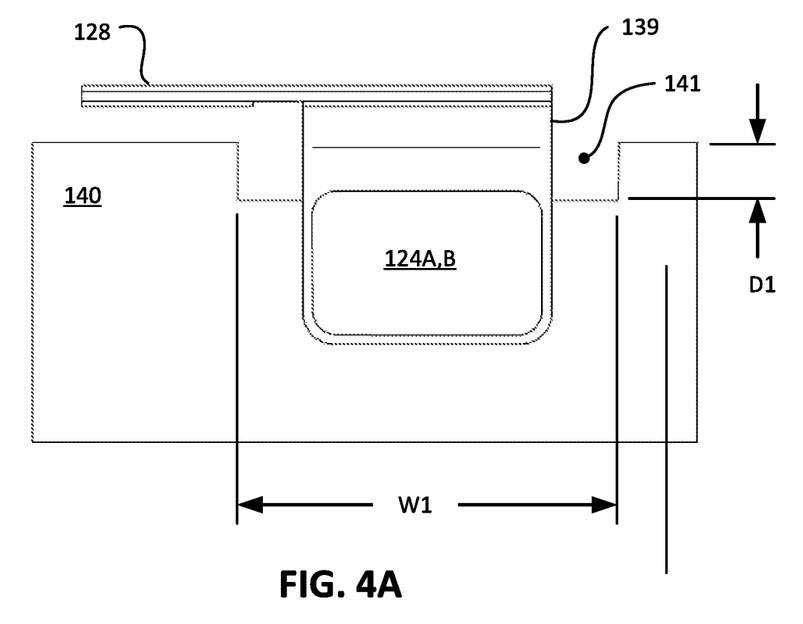
FIG. 4A illustrates a top view of an embodiment of an S-bend service loop in relation to a printed circuit board.

FIG. 4A illustrates a top view of the S-bend service loop 139 in relation to a printed circuit board 140. As shown, to accommodate the S-bend service loop 139, the printed circuit board 140 incorporates a first cutout 141 having a width W1 and a depth D1 that is sized to accommodate an entire width of the S-bend service loop.

Figure 4B:
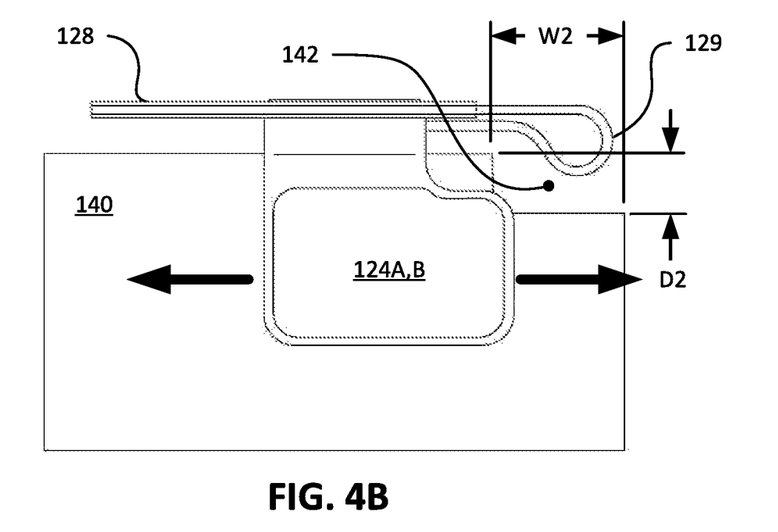
FIG. 4B illustrates a top view of a switch-back service loop in relation to a printed circuit board, in accordance with various embodiments of the subject technology.

FIG. 4B illustrates a top view of the switch-back service loop 129 in relation to a printed circuit board 140, in accordance with various embodiments of the subject technology. To accommodate the switch-back service loop 129, the printed circuit board 140 includes a second cutout 142 having a width W2 that is less than the width W1 of the first cutout 141, and a depth D2 that is less than the depth D1 of the first cutout 141. The second cutout 142 is disposed on a corner of the printed circuit board 140 and is sized to accommodate a width of the switch-back service loop 129. In one aspect, because the switch-back service loop 129 extends longitudinally from the elongated portion 128, the width of the switch-back service loop 129 can be significantly reduced. In other aspects, by reducing the size of the second cutout 142, the printed circuit board 140 may house additional components, as necessary, thereby increasing a packaging efficiency of the printed circuit board 140.

Figure 5A:
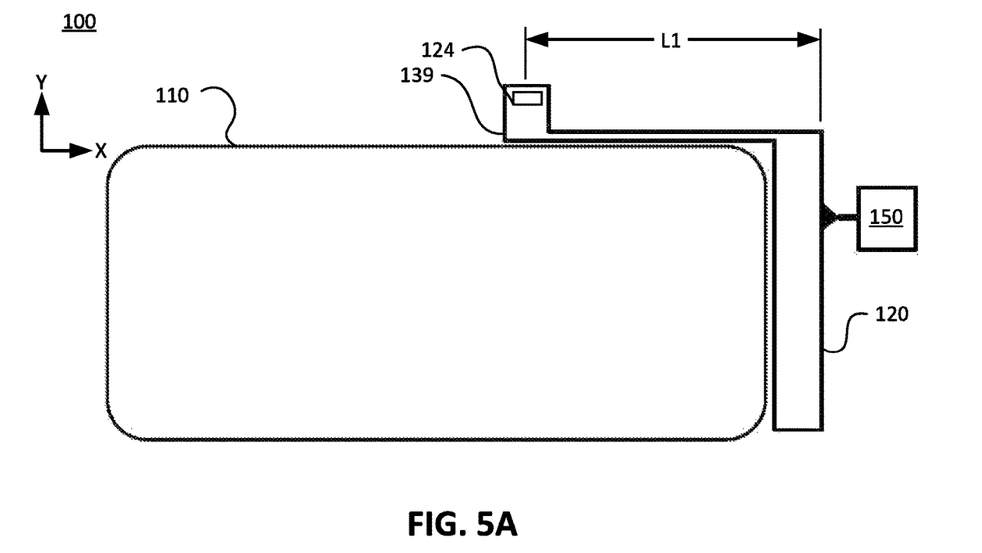
FIG. 5A illustrates a schematic of a datum associated with an S-bend service loop, in accordance with various embodiments of the subject technology.

FIG. 5A illustrates a schematic of a datum associated with the S-bend service loop 139. In one aspect, because the S-bend service loop 139 design does not include longitudinal (e.g., along the x-direction) adjustment of the board-to-board connector 124, a datum 150 must be located at the battery management circuit module 120 to ensure that the board-to-board connector 124 is located at the proper location, at a distance L1 from the datum 150, to connect to a system component.

Figure 5B:
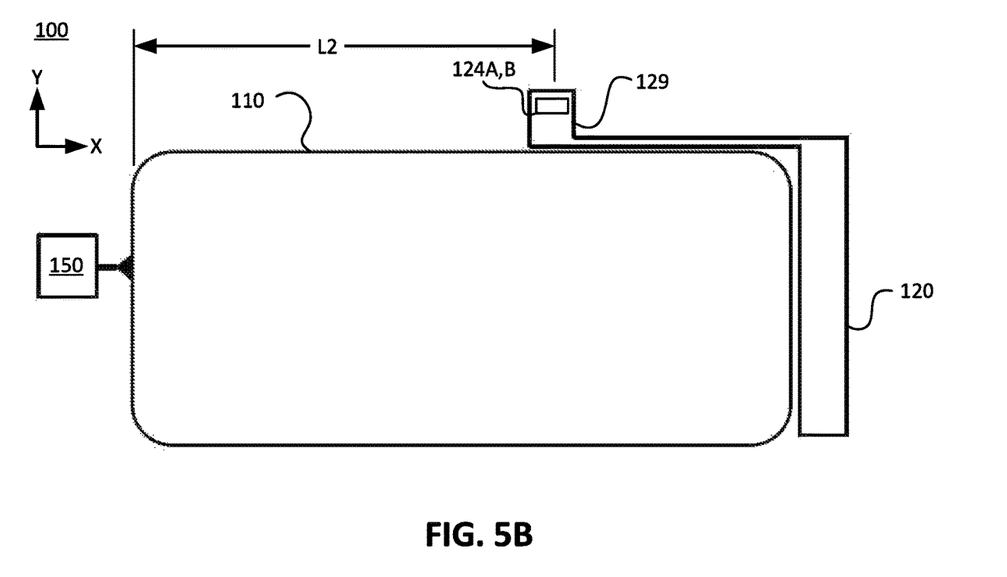
FIG. 5B illustrates a schematic of a datum associated with a switch-back service loop, in accordance with various embodiments of the subject technology.

FIG. 5B illustrates a schematic of a datum associated with a switch-back service loop 129, in accordance with various embodiments of the subject technology. In one aspect, because the switch-back service loop 129 provides longitudinal (e.g., along the x-direction) adjustment of the board-to-board connector 124A-B, the datum 150 may be located at an end of the enclosure 110 of the battery pack 100. Because the switch-back service loop 129 enables the board-to-board connector 124A-B to be adjusted longitudinally (e.g., along the x-direction) to connect to a system component, the board-to-board connector 124A-B may be located at a distance L2, as measured from the datum 150 at the end of the enclosure 110, to connect to a system component with minimal concern of tolerance stackup.

Figure 6A:
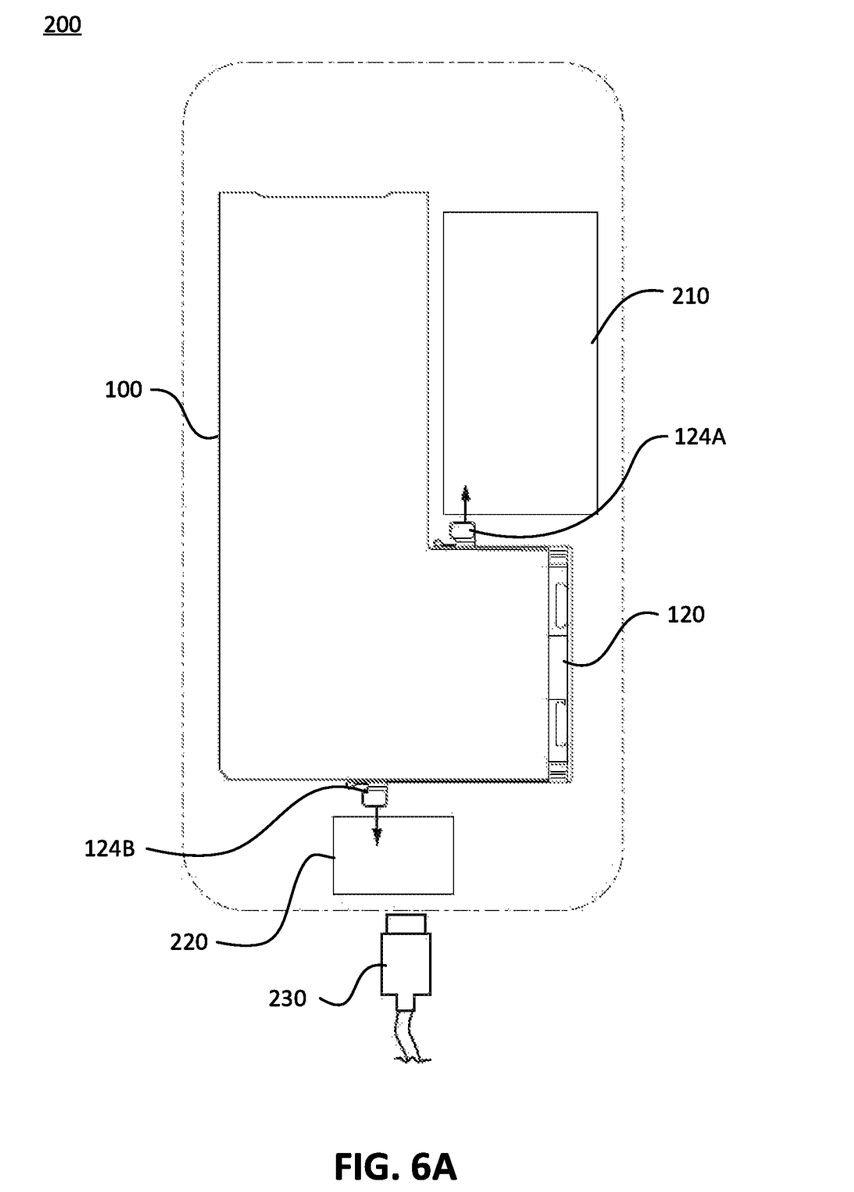
FIG. 6A illustrates a top view of a portable electronic device, in accordance with various embodiments of the subject technology.

FIG. 6A illustrates a top view of a portable electronic device 200, in accordance with various embodiments of the subject technology. The portable electronic device may comprise a first printed circuit board 210, a second printed circuit board 220, and the battery pack 100. As described above with reference to FIGS. 1-2, the battery pack 100 comprises the management circuit module 120 coupled to the first and second terminals, 109A and 109B respectively. The management circuit module 120 comprises the first board-to-board connector 124A disposed proximal to a first end of the management circuit module 120. The first board-to-board connector 124A is electrically coupled to the first printed circuit board 210. The first printed circuit board 210 may comprise a main logic board having a processor, memory, speaker, and/or other components of the portable electronic device 200.

The management circuit module 120 further comprises the second board-to-board connector 124B disposed proximal to a second end of the management circuit module 120. The second board-to-board connector 124B may be positioned opposite the first board-to-board connector 124A with respect to the management circuit module 120. The second board-to-board connector 124B is electrically coupled to the second printed circuit board 220. The second printed circuit board 220 may comprise a charging board having components thereon for charging the battery pack 100. Charging components may include a charging integrated circuit, wireless charging integrated circuit, and/or a charging inductor. The second printed circuit board 220 may also contain other components associated with the portable electronic device 200, such as an amplifier, speaker, microphone, and/or haptic element. In one aspect, by offloading components that are conventionally placed on a single printed circuit board to the second printed circuit board 220, a size of the first printed circuit board 210 may be reduced to thereby enable a larger battery pack 100 for the portable electronic device 200. In another aspect, by offloading charging components to the second printed circuit board 220, flexibility of locating the charging components within a portable electronic device is improved, thereby enabling charging components to be located at a location within the portable electronic device having additional space for accommodating larger charging components (e.g., inductors) that enable an increase in charging efficiency and reduction in charging time.

As shown in FIG. 6A, the second printed circuit board 220 is disposed proximate to a port of the portable electronic device 200 that is configured to receive an external connector 230. The external connector 230 may comprise a charging cable that is configured to supply a charging current to the battery pack 100 via the second printed circuit board 220. In some aspects, and as described with reference to FIGS. 6B and 6C, by arranging components of the portable electronic device 200 amongst the first printed circuit board 210 and the second printed circuit board 220, a charging and discharging efficiency is increased over systems utilizing a single connector to connect to a printed circuit board.

Figure 6B:
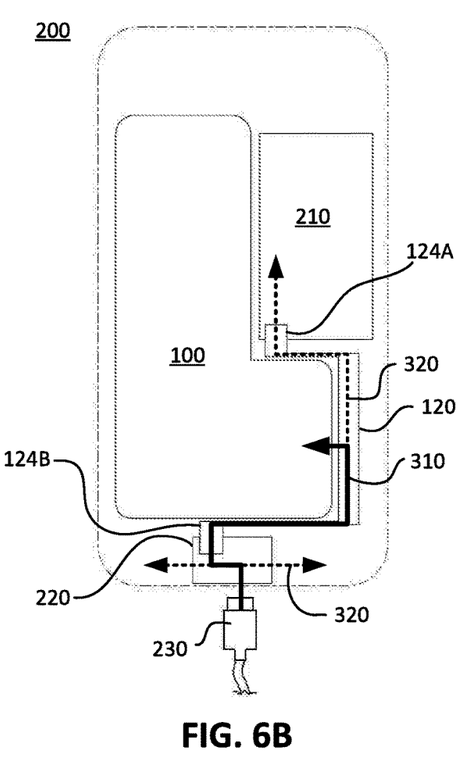
FIG. 6B illustrates a top view of a portable electronic device showing a charging current, in accordance with various embodiments of the subject technology.

FIG. 6B illustrates a top view of the portable electronic device 200 showing a charging current, in accordance with various embodiments of the subject technology. Upon insertion of the external connector 230 providing a charging current, a primary current 310 is supplied to the second printed circuit board 220 having charging components, such as a charging integrated circuit. Primary current 310 is supplied to the management circuit module 120 via the second board-to-board connector 124B. The primary current 310 is then supplied to the one or more battery cells of the battery pack 100 for charging or recharging of the battery pack 100. The battery pack 100 is therefore charged using primary current 310 without utilizing the first printed circuit board 210. In one aspect, by utilizing only the charging components of the second printed circuit board 220 to charge the battery pack 100, a charging efficiency is increased because there is no need to provide primary current 310 to the first printed circuit board 210. In another aspect, because the second printed circuit board 220 is disposed proximate to the external connector 230, an impedance is reduced due to a shortened length for the current to travel from the external connector 230 to the battery pack 100.

In other aspects, during charging, the second printed circuit board 220 may provide supplemental current 320 to other components of the portable electronic device 200 without utilizing the battery pack 100 or the first printed circuit board 210. In another aspect, the management circuit module 120 may provide supplemental current 320 to the first printed circuit board 210 via the first board-to-board connector 124A.

Figure 6C:
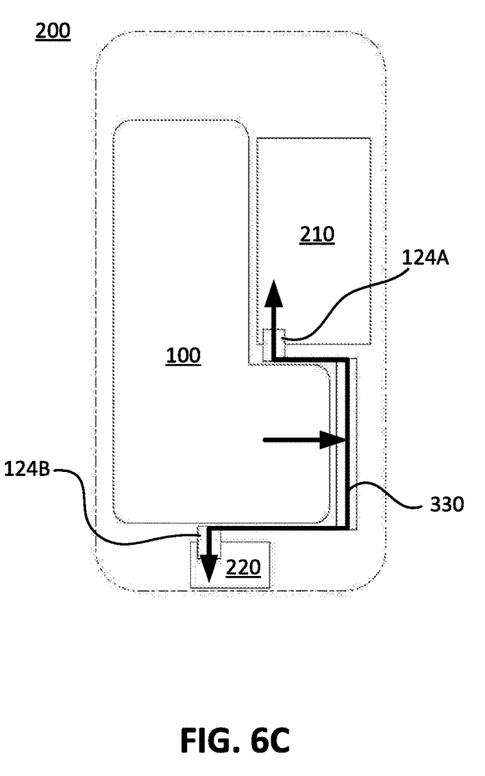
FIG. 6C illustrates a top view of a portable electronic device showing a discharging current, in accordance with various embodiments of the subject technology.

FIG. 6C illustrates a top view of the portable electronic device 200 showing a discharging current, in accordance with various embodiments of the subject technology. During discharge of the battery pack 100, a discharge current 330 is provided by the battery pack 100 to the first printed circuit board 210 and the second printed circuit board 220 via the first board-to-board connector 124A and the second board-to-board connector 124B, respectively. In one aspect, the second printed circuit board 220 may draw more power from the battery pack 100 than the first printed circuit board 210. Because the management circuit module 120 utilizes more than one board-to-board connector (e.g., the first board-to-board connector 124A and the second board-to-board connector 124B), the management circuit module 120 may provide more power or current to the second printed circuit board 220 than the first printed circuit board 210, or vice versa. In one aspect, by utilizing more than one board-to-board connector (e.g., the first board-to-board connector 124A and the second board-to-board connector 124B), current or power may be directed to a particular circuit board or components, as desired, thereby increasing an efficiency for the discharge current 330.

Figure 7:
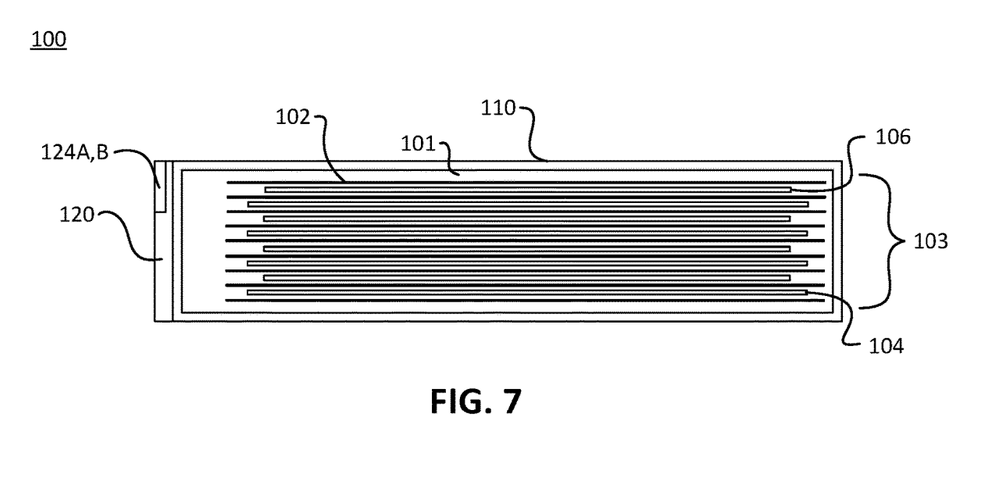
FIG. 7 illustrates a cross-section view of a battery pack, in accordance with various embodiments of the subject technology.

FIG. 7 illustrates a cross-section view of a battery pack 100, in accordance with various embodiments of the subject technology. The battery pack 100 includes a battery cell 103, an enclosure 110, and a management circuit module 120. The management circuit module 120 is configured to manage and monitor the battery cell 103 and includes a first board-to-board connector 124A and a second board-to-board connector 124B. The first board-to-board connector 124A and the second board-to-board connector 124B are each configured to engage with corresponding connectors on a portable electronic device to provide power to components of the portable electronic device.

The battery cell 103 includes a set of layers comprising a cathode 104, a separator 102, and an anode 106. The set of layers of the battery cell 103 may be wound to form a jelly roll structure or can be stacked to form a stacked-cell structure. The set of layers are enclosed within the enclosure 110 and may be immersed in an electrolyte 101. The electrolyte can additionally be in the form of a solution, a gel, or a solid.

Figure 8:
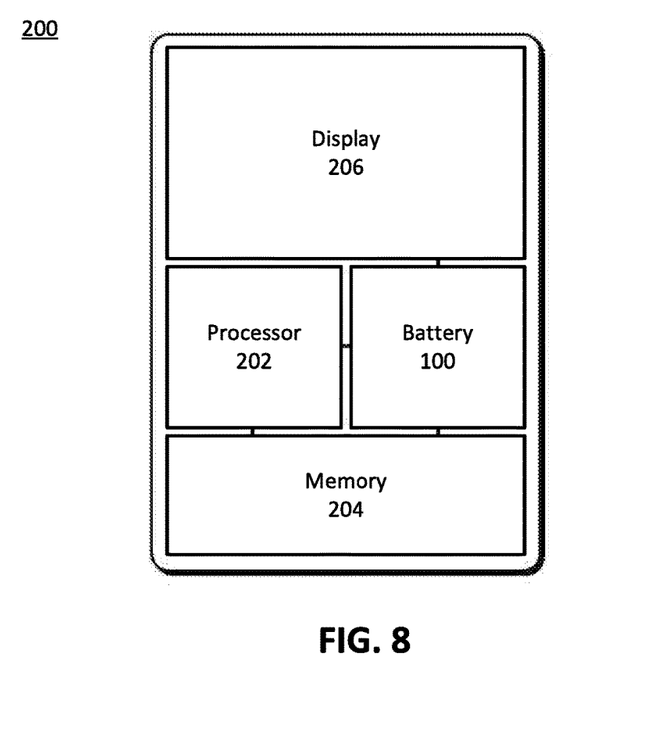
FIG. 8 illustrates a portable electronic device, in accordance with various embodiments of the subject technology.

FIG. 8 illustrates a portable electronic device 200, in accordance with various embodiments of the subject technology. The above-described rechargeable battery 100 can generally be used in any type of electronic device. For example, FIG. 8 illustrates a portable electronic device 200 which includes a processor 202, a memory 204 and a display 206, which are all powered by the battery 100. Portable electronic device 200 may correspond to a laptop computer, tablet computer, mobile phone, personal digital assistant (PDA), digital music player, watch, and wearable device, and/or other type of battery-powered electronic device. Battery 100 may correspond to a battery pack that includes one or more battery cells. The battery 100 utilizes a dual board-to-board connector battery management circuit module utilizing a switch-back service loop as described above.

Figure 9:
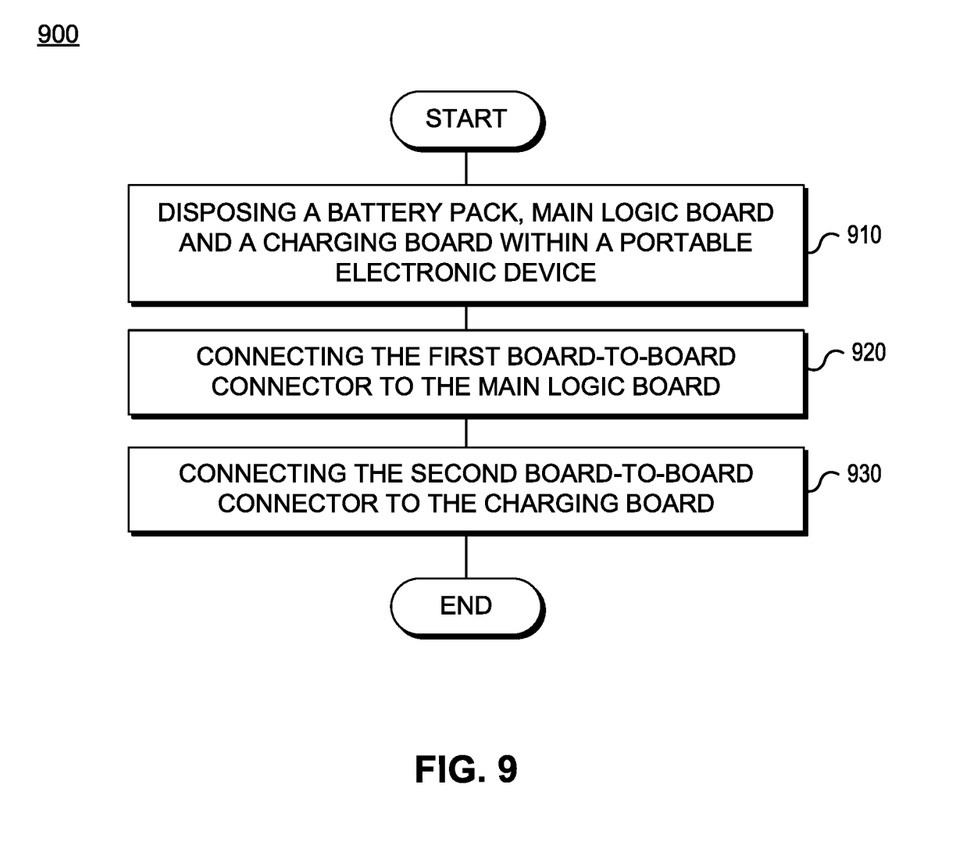
FIG. 9 illustrates an example method for connecting a battery to components of a portable electronic device, in accordance with various embodiments of the subject technology.

FIG. 9 illustrates an example method 900 for connecting a battery to components of a portable electronic device, in accordance with various embodiments of the subject technology. It should be understood that, for any process discussed herein, there can be additional, fewer, or alternative steps performed in similar or alternative orders, or in parallel, within the scope of the various embodiments unless otherwise stated.

At operation 910, a battery pack, main logic board, and a charging board are disposed within a portable electronic device. The battery pack includes a set of layers comprising a cathode layer, an anode layer, and a separator layer disposed between the cathode layer and the anode layer. The set of layers are enclosed in an enclosure which may comprise a can, pouch, or other type of enclosure as would be known by a person of ordinary skill. A first and second terminal are electrically coupled to the cathode layer and anode layer, respectively, and extend from the enclosure. A management circuit module is coupled to the first and second terminal at an opposite end. The management circuit module comprises a first board-to-board connector disposed proximal to a first end of the management circuit module, and a second board-to-board connector disposed proximal to a second end of the management circuit module. The second board-to-board connector may be positioned opposite the first board-to-board connector.

At operation 920, the first board-to-board connector is connected to the main logic board. The first board-to-board connector utilizes a switch back service loop to provide an additional length of flexible printed circuit board in a longitudinal direction for connecting to the main logic board. In one aspect, the main logic board comprises a cutout at a corner of the main logic board to accommodate the switch back service loop of the first board-to-board connector.

At operation 930, the second board-to-board connector is connected to the charging board. The second board-to-board connector utilizes a switch back service loop to provide an additional length of flexible printed circuit board in a longitudinal direction for connecting to the charging board.

In one aspect, the charging board comprises a cutout at a corner of the charging board to accommodate the switch back service loop of the second board-to-board connector. The method may also include arranging the charging board to be proximate to a charging port of the portable electronic device.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A battery pack, comprising:
   a set of layers comprising a cathode layer, an anode layer, and a separator layer disposed between the cathode layer and the anode layer;
   an enclosure enclosing the set of layers;
   a first and second terminal extending from the enclosure, the first and second terminal electrically coupled to the cathode layer and the anode layer, respectively;
   a management circuit module coupled to the first and second terminal, the management circuit module comprising:
      a first board-to-board connector disposed proximal to a first end of the management circuit module and on an elongated portion of the management circuit module, wherein the first board-to-board connector utilizes a first switch back service loop, the first switch back service loop extending in a longitudinal direction with respect to the elongated portion to enable the first board-to-board connector to move longitudinally along the elongated portion; and
      a second board-to-board connector disposed proximal to a second end of the management circuit module and positioned opposite the first board-to-board connector.

2. The battery pack of claim 1, wherein the second board-to-board connector utilizes a second switch back service loop.

3. The battery pack of claim 1, wherein the management circuit module comprises a flexible circuit board.

4. The battery pack of claim 1, wherein the management circuit module comprises a rigid-flexible circuit board.

5. The battery pack of claim 1, wherein the first board-to-board connector is configured to connect to a first printed circuit board.

6. The battery pack of claim 5, wherein the second board-to-board connector is configured to connect to a second printed circuit board that is separate from the first printed circuit board.

7. A portable electronic device, comprising:
   a first printed circuit board;
   a second printed circuit board;
   a battery pack comprising:
      a set of layers comprising a cathode layer, an anode layer, and a separator layer disposed between the cathode layer and the anode layer;
      an enclosure enclosing the set of layers;
      a first and second terminal extending from the enclosure, the first and second terminal electrically coupled to the cathode layer and the anode layer, respectively;
      a management circuit module coupled to the first and second terminal, the management circuit module comprising:
         a first board-to-board connector disposed proximal to a first end of the management circuit module and on an elongated portion of the management circuit module, wherein the first board-to-board connector utilizes a first switch back service loop, the first switch back service loop extending in a longitudinal direction with respect to the elongated portion to enable the first board-to-board connector to move longitudinally along the elongated portion; and
         a second board-to-board connector disposed proximal to a second end of the management circuit module and positioned opposite the first board-to-board connector.

8. The portable electronic device of claim 7, wherein the first printed circuit board comprises a main logic board comprising a memory and a processor.

9. The portable electronic device of claim 8, wherein the second printed circuit board comprises a charging board comprising an inductor.

10. The portable electronic device of claim 9, wherein the charging board is disposed proximate to a port of the portable electronic device, the port configured to receive an external connector.

11. The portable electronic device of claim 9, wherein the charging board draws more power from the battery pack than the main logic board.

12. The portable electronic device of claim 7, wherein the second board-to-board connector utilizes a second switch back service loop.

13. A method for connecting a battery pack to components of a portable electronic device, the method comprising:
   disposing the battery pack, a main logic board, and a charging board within the portable electronic device, the battery pack comprising:
      a set of layers comprising a cathode layer, an anode layer, and a separator layer disposed between the cathode layer and the anode layer;
      an enclosure enclosing the set of layers;
      a first and second terminal extending from the enclosure, the first and second terminal electrically coupled to the cathode layer and the anode layer, respectively;
      a management circuit module coupled to the first and second terminal, the management circuit module comprising:
         a first board-to-board connector disposed proximal to a first end of the management circuit module and on an elongated portion of the management circuit module, wherein the first board-to-board connector utilizes a first switch back service loop, the first switch back service loop extending in a longitudinal direction with respect to the elongated portion to enable the first board-to-board connector to move longitudinally along the elongated portion; and a second board-to-board connector disposed proximal to a second end of the management circuit module and positioned opposite the first board-to-board connector;

connecting the first board-to-board connector to the main logic board; and connecting the second board-to-board connector to the charging board.

14. The method of claim 13, further comprising arranging the charging board to be proximate to a charging port of the portable electronic device.

15. The method of claim 13, wherein the main logic board comprises a cutout at a corner of the main logic board to accommodate the first switch back service loop of the first board-to-board connector.

16. The method of claim 13, wherein the second board-to-board connector utilizes a second switch back service loop.

17. The method of claim 16, wherein the charging board comprises a cutout at a corner of the charging board to accommodate the second switch back service loop of the second board-to-board connector.

\* \* \* \* \*